(12) United States Patent
Schlub et al.

(10) Patent No.: US 8,971,821 B2
(45) Date of Patent: Mar. 3, 2015

(54) ROBOTIC WIRELESS TEST SYSTEM

(71) Applicant: Apple Inc., Cupertino, CA (US)

(72) Inventors: Robert W. Schlub, Cupertino, CA (US); Boon Wai Shiu, San Jose, CA (US); Chun-Lung Chen, Sunnyvale, CA (US); Jonathan M. Haylock, Los Angeles, CA (US); Hagan P. O'Connor, Monte Sereno, CA (US)

(73) Assignee: Apple Inc., Cupertino, CA (US)

( * ) Notice: Subject to any disclaimer, the term of this patent is extended or adjusted under 35 U.S.C. 154(b) by 168 days.

(21) Appl. No.: 13/681,685

(22) Filed: Nov. 20, 2012

(65) Prior Publication Data

US 2014/0141726 A1    May 22, 2014

(51) Int. Cl.
| | | |
|---|---|---|
| H04B 17/00 | (2006.01) | |
| H04W 24/00 | (2009.01) | |
| G01R 29/08 | (2006.01) | |
| G01R 29/10 | (2006.01) | |

(52) U.S. Cl.
CPC .......... H04W 24/00 (2013.01); G01R 29/0857 (2013.01); G01R 29/0871 (2013.01); G01R 29/105 (2013.01); H04B 17/00 (2013.01)
USPC ...................... 455/67.12; 455/67.11; 455/423

(58) Field of Classification Search
USPC ............ 455/423, 67.11, 67.12, 67.14, 115.1, 455/115.2; 324/750, 750.01
See application file for complete search history.

(56) References Cited

U.S. PATENT DOCUMENTS

| | | | |
|---|---|---|---|
| 7,477,877 B2 | 1/2009 | Bednasz et al. | |
| 7,925,253 B2 * | 4/2011 | Breit et al. | 455/425 |
| 8,295,777 B1 | 10/2012 | Yenney et al. | |
| 8,412,112 B2 * | 4/2013 | Foegelle | 455/67.12 |
| 2002/0074993 A1 | 6/2002 | Boswell et al. | |
| 2002/0160717 A1 * | 10/2002 | Persson et al. | 455/67.1 |
| 2006/0017630 A1 * | 1/2006 | Kildal | 343/703 |
| 2006/0055592 A1 | 3/2006 | Leather et al. | |
| 2006/0246843 A1 | 11/2006 | Hirvonen et al. | |
| 2008/0129615 A1 | 6/2008 | Breit et al. | |
| 2010/0171669 A1 | 7/2010 | Ito et al. | |
| 2011/0084887 A1 * | 4/2011 | Mow et al. | 343/703 |
| 2011/0124295 A1 | 5/2011 | Mahjoubi Amine et al. | |

(Continued)

FOREIGN PATENT DOCUMENTS

| | | |
|---|---|---|
| EP | 1359428 | 11/2003 |
| JP | 2008164424 | 7/2008 |
| KR | 2006023422 | 3/2006 |
| WO | 0036770 | 6/2000 |
| WO | 0062332 | 10/2000 |

*Primary Examiner* — Sonny Trinh
(74) *Attorney, Agent, or Firm* — Treyz Law Group; G. Victor Treyz; Michael H. Lyons

(57) ABSTRACT

A test system may include a wireless test chamber with metal walls lined with pyramidal absorbers. A trapdoor may be provided in a wall opening to accommodate a robotic arm. The robotic arm may have grippers that grip a device under test or a support structure that is supporting a device under test. The robotic arm may move the device under test to a docking station for automatic battery charging during testing. When it is desired to perform wireless tests on a device under test, the robotic arm may move the device under test through the trapdoor into an interior portion of the test chamber. A turntable and movable test antenna may be used to rotate the device under test while varying angular orientations between test antenna and device under test. Emitted radiation levels can be measured using a liquid filled phantom and test probe on a robotic arm.

22 Claims, 14 Drawing Sheets

(56) References Cited

U.S. PATENT DOCUMENTS

2011/0172807 A1    7/2011   Merrow
2013/0002273 A1*   1/2013   Min et al. ................ 324/750.01
2013/0002275 A1*   1/2013   Min et al. ................ 324/750.02
2014/0055147 A1*   2/2014   Haylock et al. ............... 324/602
2014/0141727 A1*   5/2014   Kildal et al. ............... 455/67.12

* cited by examiner

ROBOTIC WIRELESS TEST SYSTEM

BACKGROUND

This relates to electronic devices and, more particularly, to systems for testing wireless electronic devices.

Electronic devices such as cellular telephones and other portable devices are often provided with wireless circuitry. For example, cellular telephones contain wireless radio-frequency transceiver circuitry for communicating using cellular telephones bands. Electronic devices may also contain circuitry for communicating using wireless local area network communications bands and other communications bands of interest.

Before devices are sold to customers, extensive wireless tests are performed. Testing allows designers to optimize antenna and wireless transceiver performance. Testing also ensures that regulatory limits on emitted radiation levels are satisfied.

Modern wireless electronic devices are becoming increasingly sophisticated. For example, wireless devices are being designed with the capability to operate in large numbers of frequency bands using multiple antennas. Conventional test systems can become overburdened when performing desired tests over multiple bands and antennas, leading to potential delays.

It would therefore be desirable to be able to provide improved test systems for wirelessly testing electronic devices.

SUMMARY

Devices under test may be wirelessly tested in a test system. The test system may include a wireless test chamber with metal walls lined with pyramidal absorbers. A trapdoor may be provided in an opening in a chamber wall to accommodate a robotic arm or other robotic system.

A robotic arm may have grippers that can grip a device under test or that can grip a phantom head or other support structure that is supporting a device under test. The robotic arm may move the device under test to a docking station for automatic battery charging during testing. When it is desired to perform wireless tests on a device under test, the robotic arm may move a device under test that is outside of the chamber through the trapdoor into an interior portion of the test chamber. The robotic arm may also move devices under test within the interior of the test chamber to facilitate testing.

Movable support structures such as a turntable and a test antenna positioner may be used to place a device under test in a variety of angular orientations with respect to a test antenna during testing. The robotic arm may periodically flip the device under test or may otherwise adjust the placement of the device under test on the turntable to ensure that the device under test is tested in all desired orientations.

Emitted radiation levels can be measured using a liquid filled phantom and test probe on a robotic arm. The test probe may be moved within the liquid filled phantom while another robotic arm moves a device under test to a variety of different positions with respect to the phantom.

Further features of the invention, its nature and various advantages will be more apparent from the accompanying drawings and the following detailed description of the preferred embodiments.

DETAILED DESCRIPTION

Wireless testing may be performed on electronic equipment that communicates using wireless signals. The electronic equipment that is being tested may sometimes be referred to as a wireless electronic device or device under test.

Figure 1:
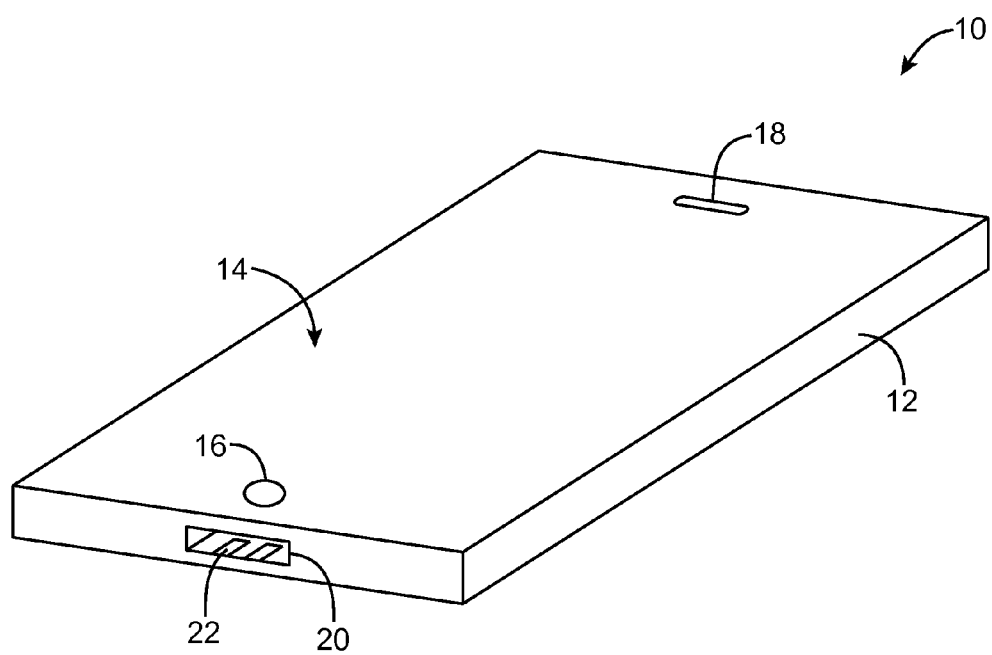
FIG. 1 is a front perspective view of an illustrative electronic device of the type that may be tested using a wireless test system in accordance with an embodiment of the present invention.

An illustrative electronic device of the type that may be wirelessly tested is shown in FIG. 1. Device 10 of FIG. 1 may be a handheld device such as a cellular telephone or media player, a tablet computer, a notebook computer, other portable computing equipment, a wearable or miniature device such as a wristwatch or pendant device, a television, a computer monitor, a computer integrated into a computer display, a set-top box, a wireless access point, a desktop computer, or other electronic equipment.

As shown in FIG. 1, electronic device 10 may include a display such as display 14. Display 14 may be a touch screen that incorporates a layer of conductive capacitive touch sensor electrodes or other touch sensor components or may be a display that is not touch-sensitive. Display 14 may include an array of display pixels formed from liquid crystal display (LCD) components, an array of electrophoretic display pixels, an array of electrowetting display pixels, or display pixels based on other display technologies.

Display 14 may be protected using a display cover layer such as a layer of transparent glass or clear plastic. Openings may be formed in the display cover layer. For example, an opening may be formed in the display cover layer to accommodate a button such as button 16 and an opening such as opening 18 may be used to form a speaker port. Device configurations without openings in display 14 may also be used for device 10.

Device 10 may have a housing such as housing 12. Housing 12, which may sometimes be referred to as an enclosure or case, may be formed of plastic, glass, ceramics, fiber composites, metal (e.g., stainless steel, aluminum, etc.), other suitable materials, or a combination of any two or more of these materials.

Housing 12 may be formed using a unibody configuration in which some or all of housing 12 is machined or molded as a single structure or may be formed using multiple structures (e.g., an internal frame structure, one or more structures that form exterior housing surfaces, etc.).

Device 10 may have one or more connector ports such as connector port 20. Connector port 20 may have associated contacts such as contacts 22. Contacts 22, which may sometimes be referred to as contact pins or pins, may be used to transmit and receive data. Device 10 may also receive power from an external source using contacts 22 and may power external accessories using contacts 22.

In general, contacts 22 may include any suitable number of power contacts and data contacts. Contacts 22 may also include some contacts that are used to convey both power and data signals. The connector structures associated with port 20 may have two or more contacts 22, three or more contacts 22, four or more contacts 22 (e.g., a pair of power pins and a pair of differential serial data pins), five or more contacts, eight or more contacts, etc.

Connector port 20 may have a male connector, a female connector, or may form part of a symmetrical connector. Configurations in which connector 20 of device 10 is a female connector may sometimes be described herein as an example. This is, however, merely illustrative. Devices under test such as device 10 of FIG. 1 may have any suitable number of connectors 20, may have any suitable number of contacts 22 in each connector 20, and may have connectors 20 of any suitable shape (e.g., audio jack format, data port format, Universal Serial Bus format, etc.).

Wireless testing may involve the transmission and reception of wireless signals in a number of different wireless communications bands of interest. The gathering of test data for all desired frequencies of interest and the testing of all antenna structures and other components within a wireless device may take a significant period of time. As a result, it may be desirable to power devices under test for hours or even days so that testing may be completed. If desired, power can be provided to devices under test using cables and cables can be used to communicate with devices under test. For example, devices under test may be tethered to cables within a test chamber. Often, however, it may be desirable to perform tests without any attached cables. If cables are attached to a device under test during testing, the cables may electromagnetically influence radio-frequency signals in the vicinity of the device under test and lead to potentially inaccurate test results.

In order to wirelessly test a device under test in a wireless test chamber without any attached cables, devices under test may be powered with batteries. For example, a cellular telephone or tablet computer that is being wirelessly tested may use internal battery power to operate radio-frequency transceiver circuitry within the device under test.

To ensure that accurate real-world test results are obtained, it is desirable to use a battery in a device under test that is identical or nearly identical to the type of battery that would be used in a production version of the device under test. Such batteries may contain sufficient power for hours of standby time or normal usage, but can become depleted when subjected to the power demands of continuous wireless testing. Accordingly, test systems may be provided with recharging capabilities.

To enhance testing efficiency, automated systems (sometimes referred to as robotic systems or robots) may be used to recharge devices under test. This allows devices under test to be tested over long periods of time with little or no intervention from an operator. As an example, a set of devices under test can be loaded into an automated wireless test system before a weekend. Tests may then be performed automatically over the weekend, even if the test system is unstaffed or lightly staffed with test personnel.

During automated testing, the batteries in the devices under test may become depleted. In a wireless test system with automated battery recharging, however, each time a battery in a device under test becomes depleted, a robot within the test system may move the device under test with the depleted battery from a test station to charging station for wireless or wired charging. For example, a robotic system may move a device under test to a docking station with connectors for supplying charging power. After the battery has been recharged in the docking station and desired data has been transferred, the robot can return the device under test to the test station for additional testing. The robot can also perform tasks such as changing the orientation of the device under test within the test system.

Figure 2:
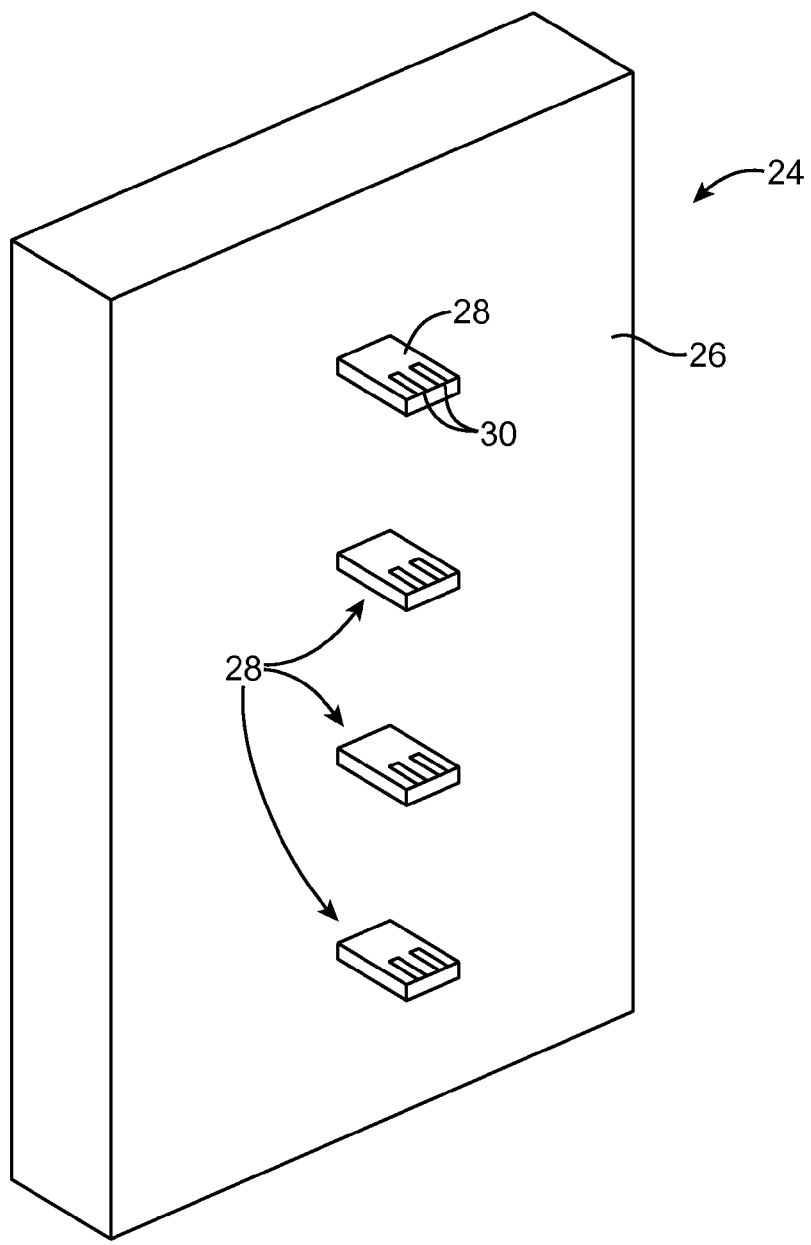
FIG. 2 is a perspective view of an illustrative docking station having connectors that are adapted to plug into connector ports on wireless electronic devices in accordance with an embodiment of the present invention.

FIG. 2 is a perspective view of an illustrative docking station of the type that may be used to receive wireless devices under test in a wireless test system. As shown in FIG. 2, docking station 24 may include a support structure such as support structure 26. Support structures 26 may be formed from plastic, metal, or other suitable structures. Features such as clamps, guiding rails, and other structures may be provided in docking station 24 to help a robot load devices under test into docking station 24.

Docking station 24 may contain connectors such as connectors 28. Each connector 28 may contain contacts 30. Contacts 30 and the other parts of connectors 28 may be configured to mate with corresponding contacts in the connectors of devices under test. For example, contacts 30 of docking station connectors 28 may be configured to mate with contacts 22 of connector 20 of device under test 10 of FIG. 1. The number and type of contacts 30 on connectors 28 may match the number and type of contacts 22 in connector 20. If, as an example, connector 20 is a female connector with eight contacts 22, each connector 28 of docking station 24 may include eight corresponding contacts 30. Docking station 24 may have any suitable number of connectors 28 (e.g., one or more, two or more, five or more, ten or more, etc.).

Each connector 28 in docking station 24 may have the same shape or different connectors 28 may have different configurations to accommodate different types of devices under test. If desired, docking station 24 may contain different connectors that are configured to mate with different respective ports in a device under test (e.g., a data port and a power port). The configuration of FIG. 2 in which docking station 24 has a single type of connector is merely illustrative.

Figure 3:
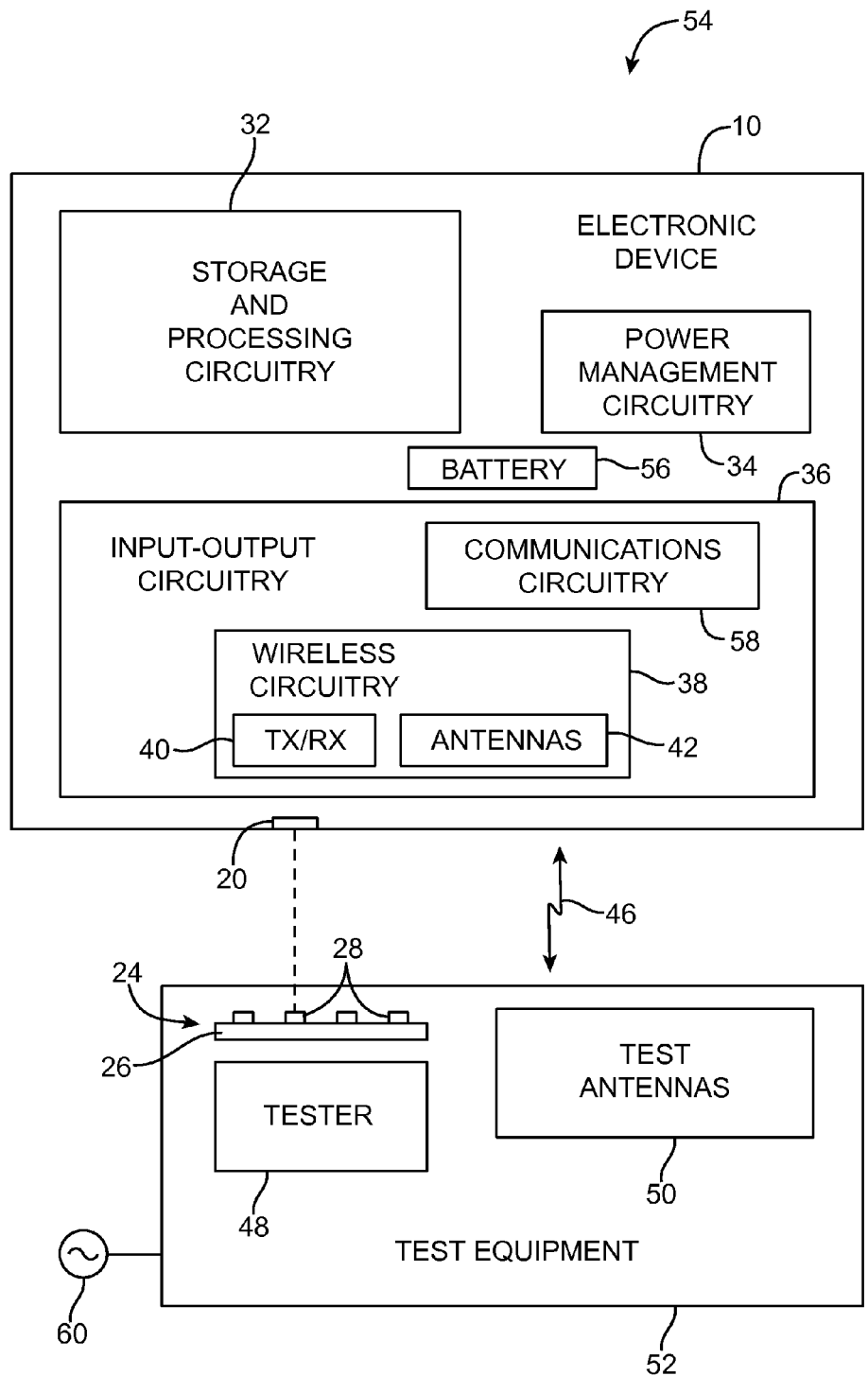
FIG. 3 is a schematic diagram of a wireless test system in accordance with an embodiment of the present invention.

FIG. 3 is a diagram of an illustrative testing system that may be used in testing device under test 10. As shown in FIG. 3, test system 54 may include test equipment 52 that is used in testing devices under test such as device under test 10. Device under test 10 may include storage and processing circuitry 32. Storage and processing circuitry 32 may include one or more processors such as microprocessors, microcontrollers, control circuits that are part of application-specific integrated circuits, audio integrated circuits, and other control circuitry. Storage and processing circuitry 32 may also include memory integrated circuits, hard disk drives, solid state drives, removable storage media, and other components for storing data.

Device 10 may receive power from external sources (e.g., alternating current or direct current power may be received via connector 20) and may use power regulator circuitry within power management circuitry 34 to provide corresponding internal power to battery 56 and the other components of device 10. Power regulator circuitry in power management circuitry 34 may also be used to provide power from battery 56 to external accessories that are coupled to device 10 and to regulate the distribution of power to internal device components.

Input-output circuitry 36 may include buttons, sensors, light-emitting components such as status indicator lights, audio components such as microphones and speakers, touch screen displays, displays without touch functionality, touch pads, keyboards, and other input-output components. Wired communications circuitry 58 may include transmitter and receiver circuitry for conveying data over wired communications paths (e.g., serial and/or parallel bus data paths coupled to connector 20, etc.). Communications circuitry 58 may, for example, include Universal Serial Bus communications circuitry that is coupled to contacts in connector 20.

Wireless circuitry 38 may include radio-frequency transceiver circuitry 40 and antenna structures 42. Radio-frequency transceiver circuitry 40 may include cellular telephone transceiver circuitry, wireless local area network transceiver circuitry (e.g., IEEE 802.11 circuitry), and satellite navigation system receiver circuitry (e.g., a receiver for receiving Global Positioning System signals). Wireless circuitry 38 may also include near field communications circuitry, circuitry for receiving radio signals, television signals, and paging signals, and transceiver circuitry for handling other communications bands of interest.

Antenna structures 42 may include one or more antennas such as inverted-F antennas, planar inverted-F antennas, patch antennas, monopole antennas, dipole antennas, loop antennas, closed and open slot antennas, antennas of other designs, and hybrid antennas that are formed from one or more antenna resonating element structures such as these. There may be one antenna in device 10, more than one antenna in device 10, two or more antennas in device 10, three or more antennas in device 10, or four or more antennas in device 10.

When it is desired to charge battery 56, a robotic system may be used to couple device 10 to a source of external power. For example, a robotic arm may pick up device under test 10 and may place device under test 10 in docking station 24. When mounted in docking station 24, connector 20 may mate with a corresponding one of connectors 28. In the docket configuration, power from line source 60 or other suitable source may be provided to device 10. In device 10, the power that is received via connector 20 may be used by power management circuitry 34 to recharge battery 56 and to power device 10. Data may also be conveyed between storage and processing circuitry 32 and test equipment 52 over the wired connection formed by mating connector 20 and connector 28. For example, test results may be conveyed from device under test 10 to external equipment and test instructions may be conveyed from external equipment to device under test 10.

Test equipment 52 may include one or more test antennas such as test antennas 50. The test antennas may be organized in an array and/or may be mounted on movable equipment (e.g., a robotic system) that allows the antennas to be moved into a variety of different angular orientations with respect to device under test 10.

Test antennas 50 may be used in transmitting wireless radio-frequency signals 46 to device under test 10 for reception by a receiver in radio-frequency transceiver circuitry 40. Test antennas 50 may also be used in receiving wireless radio-frequency signals 46 that have been transmitted by transceiver circuitry 40 to test equipment 52. Test circuitry within test equipment 50 such as vector network analyzer equipment, power meter equipment, call box equipment, and other test equipment (illustrated schematically as tester 48 in the example of FIG. 3) may be used in performing wireless tests with device under test 10. Tester 48 and antennas such as antenna 50 may be coupled to each other using coaxial cables or other transmission lines.

When it is desired to perform wireless tests on device under test 10, the robotic arm that was used in loading device under test 10 into docking station 24 can be used to decouple device under test 10 from docking station 24. Device under test 10 can be tested using test equipment 52 of FIG. 3 while device under test 10 is rotating on a rotatable test platform or other test equipment.

Figure 4:
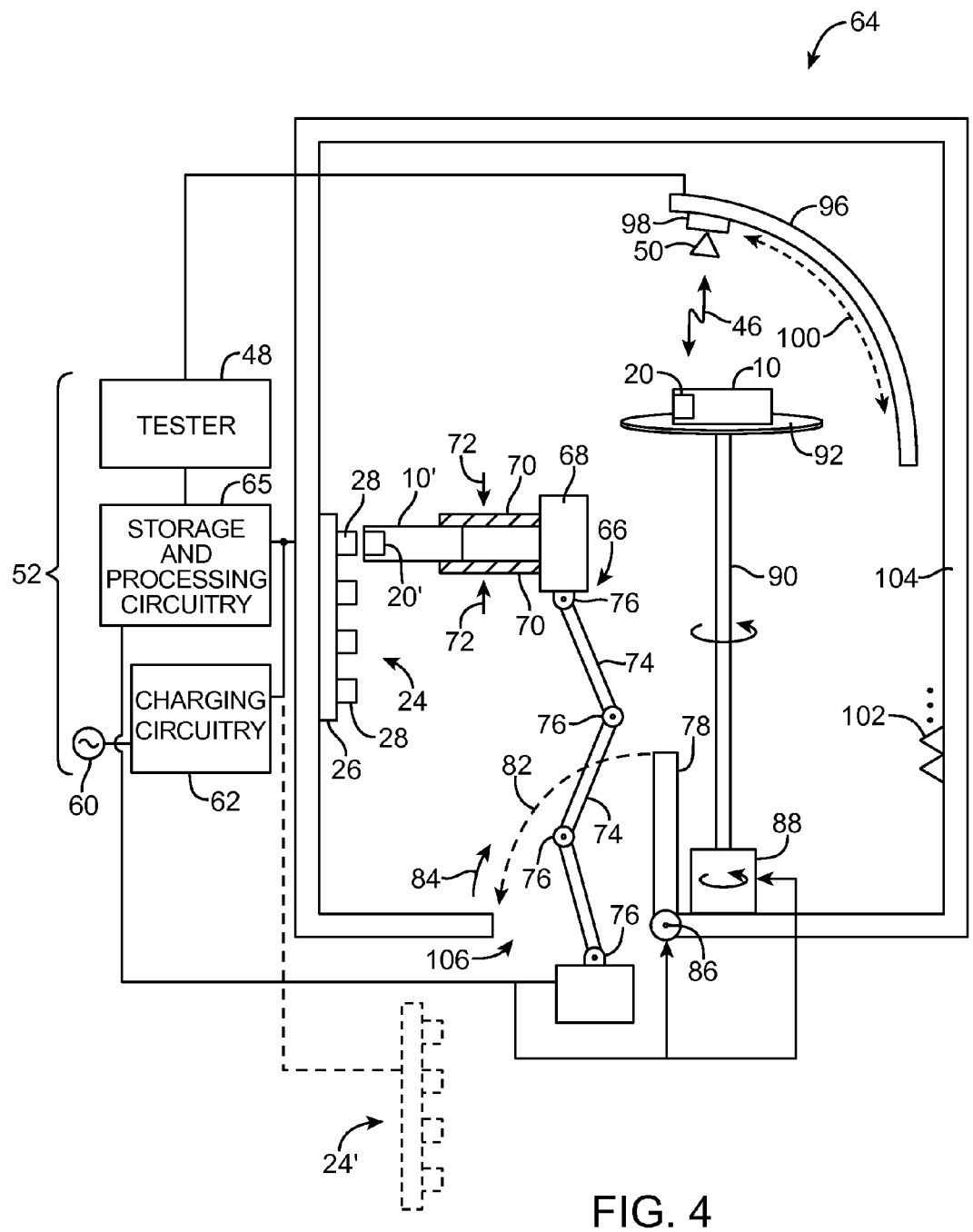
FIG. 4 is a diagram of an illustrative test chamber and associated robotic systems for performing wireless tests on wireless electronic devices in accordance with an embodiment of the present invention.

Wireless test measurements such as far field radio-frequency signal test measurements can be performed while device under test 10 is isolated from radio-frequency interference within a wireless test chamber such as wireless test chamber 64 of FIG. 4. Wireless test chamber 64 may be, for example, a chamber that is the size of a small room (e.g., a cube with dimensions of 2-20 meters so that far field measurements may be made). Chamber walls 104 may be formed from a conductive material such as metal to prevent external radio-frequency signals from reaching the interior of the chamber. Chamber wall 104 may be lined with pyramidal absorbers such as pyramidal anechoic chamber wall absorbers 102 to suppress reflections of internal signals that might otherwise have a potential to interfere with the wireless measurements being made.

Robotic system (arm) 66 may include one or more segments such as arm segments 74. Positioners such as positioners 76 may be used to control the orientation of arm segments 74 (e.g., to bend arm 66). Head 68 may contain a positioner that controls the opening and closing of gripper members such as grippers (jaws) 70 and/or that controls the rotation of grippers 70. When it is desired to hold onto a device under test or other structure in chamber 64, grippers 70 may be closed using the positioner in head 68.

As shown in FIG. 4, for example, grippers 70 may be moved in direction 72 to grip device under test 10'. Using robotic arm 66', devices under test such as device under test 10' may be loaded into docking station 24. For example, connector 20' of device under test 10' may mate with a corresponding one of connectors 28, so that charging circuitry 62 can charge the battery in device under test 10' using power source 60. When docked in docking station 24, devices under test may also communicate with test equipment 52 (e.g., to download test data from the device under test to tester 48 and/or storage and processing circuitry and/or to receive test instructions from tester 48 and/or storage and processing circuitry 65).

Test equipment 52 may include a tester for transmitting and receiving wireless signals using one or more test antennas such as illustrative horn antenna 50 of FIG. 4. Device under test 10 may be mounted on a support structure such as rotatable turntable 92 by robotic system 66. Turntable 92 may be rotated 360° about a rotational axis that runs along the center of rotating shaft 90. Shaft 90 may be controlled by rotating actuator 88. Actuator 88 may be a motor or other positioning equipment that rotates shaft 90 to control the rotational orientation of turntable 92 and device under test 10 in response to control signals from storage and processing circuitry 65 or other control circuitry associated with test equipment 52.

Storage and processing circuitry 65 may be implemented using one or more personal computers, dedicated control circuits, control circuitry that is formed as part of tester 48 (e.g., as part of a call box or vector network analyzer). Storage and processing circuitry 65 may be used to control the operation of tester 48, robotic positioning systems such as robotic system 66, turntable positioner 88 for turntable 92, and other electrical and mechanical equipment in the test system of FIG. 4.

During testing, storage and processing circuitry 64 may control test equipment 52 to direct tester 48 to transmit and receive desired wireless test signals 46 using test antennas such test antenna 50. Device under test 10 may run test software (e.g., a test version of an operating system or other testing code) that coordinates its operation with test equipment 48. For example, device under test 10 may transmit signals over a range of frequencies and a range of output powers. At the same time, test equipment 52 may use tester 48 to measure how much of the transmitted power is being received. Test antenna 50 (e.g., a horn antenna) or other test antennas may, for example, make radio-frequency signal power measurements over a range of positions.

While wireless device under test 10 is transmitting (or, if desired, receiving) signals, horn antenna 50 may be swept along track 96 or otherwise moved within chamber 64, as indicated by dashed line path 100. A positioner such as actuator 98 or other positioner may be used to control the location of horn antenna 50 along track 96. Positioner 98 may be controlled by storage and processing circuitry 65 or other equipment in test equipment 52.

Storage and processing circuitry 65 can also control the operation of trapdoor positioner 86. Trapdoor positioner 86 may be used to open and close trapdoor 78 in directions 84 and 82, respectively. Trapdoor 78 may, for example, be closed in direction 82 to cover opening 106 in the floor of chamber 64 or to cover an opening in other portions of wall 104 of chamber 64. Trapdoor 78 may be closed to cover opening 106 when robotic system 66 has retracted and is no longer present within the interior of chamber 64. Wireless tests may be performed when robotic system 66 is located outside of walls 104 of chamber 64, so that metal structures in system 66 do not influence wireless test results.

If desired, other metal structures such as metal structures associated with docking station 24 may be located outside of chamber 64. As shown in FIG. 4, for example, docking station 24 may be located in position 24' outside of chamber walls 104. With this type of configuration, robotic system 66 can load devices under test into the docking station by carrying the devices under test from the interior of chamber 64 to docking station 24' through trapdoor opening 106 in chamber wall 104. When it is desired to test a charged device under test that is located in docking station 24', robotic system 66 can move the device under test through opening 106 and can place the device under test in a desired location on turntable 92. By storing devices under test that are charging or otherwise not being currently used in wireless testing outside of chamber 64, the number of metal structures that might potentially interfere with wireless test measurements within chamber 64 can be reduced.

Robotic system 66 can position device under test 10 in a variety of positions on turntable 92. For example, robotic system 66 can initially place device under test 10 in a front-face up configuration in which display 14 of FIG. 1 is facing upwards and in which the opposing rear surface of device under test 10 is resting on the upper surface of turntable 92. After testing of device under test 10 in the front-face up configuration, robotic system 66 can flip device under test 10 so that the front face of device under test 10 is facing downwards on turntable 92 and so that the rear face of device under test 10 is facing upwards in a rear-face up configuration. By placing device under test 10 in multiple orientations on turntable 92 using robotic positioner 66, by using positioner 98 and track 96 to sweep horn antenna 50 through 90° of angle with respect to device under test 10, and by using turntable 92 to rotate device 10 through 360° of rotation about the axis of shaft 90, the wireless performance of device under test 10 can be tested in all possible angles of orientation relative to antenna 50. This allows radiation patterns (e.g., antenna efficiency plots) and other data to be gathered when testing device under test 10.

Figure 5:
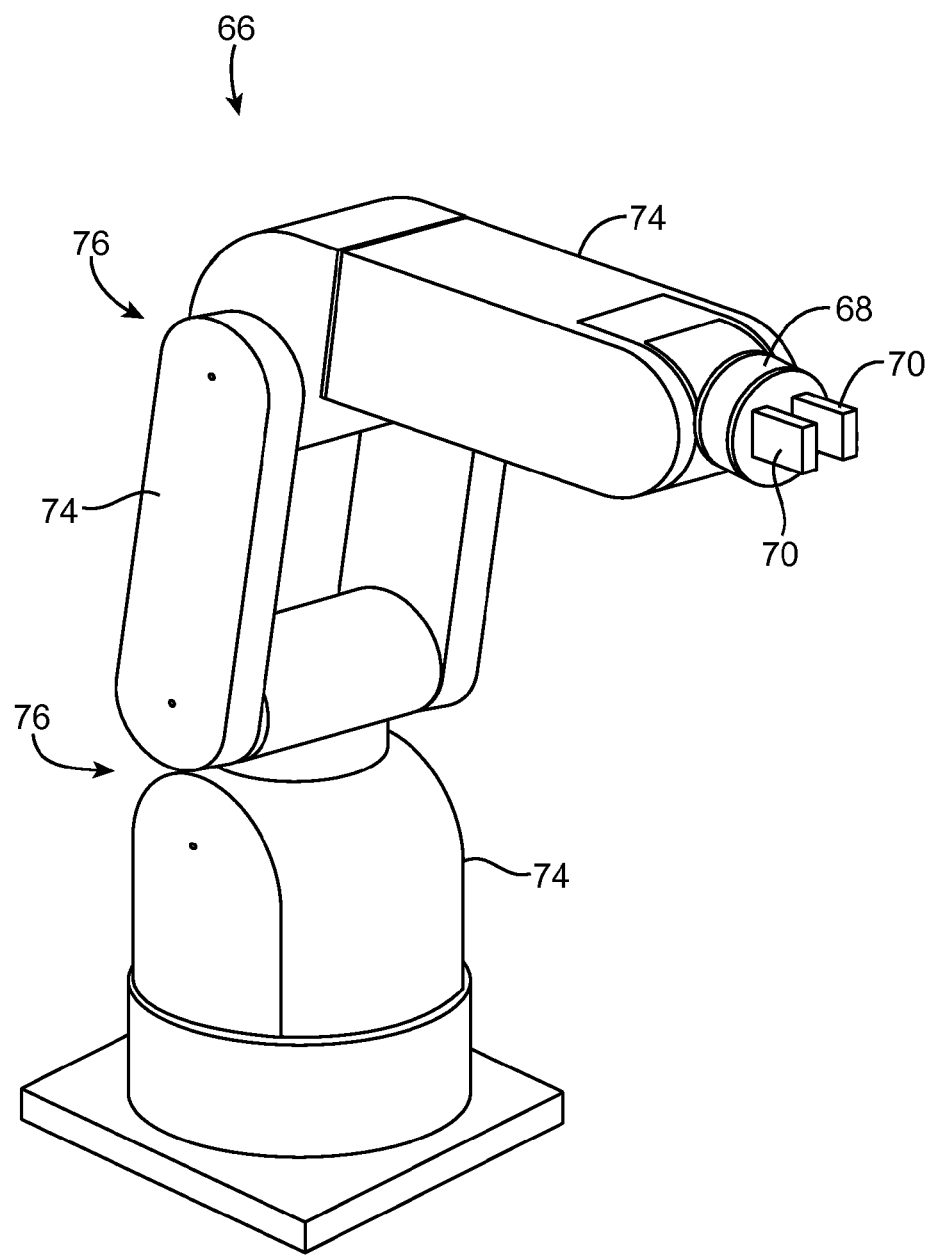
FIG. 5 is a perspective view of an illustrative robotic arm of the type that may be used to move devices under test within a wireless test chamber in accordance with an embodiment of the present invention.

FIG. 5 is a perspective view of an illustrative robotic system that may be used in positioning devices under test 10 in a test system of the type shown in FIG. 4. As shown in FIG. 5, robotic system 66 may include gripper members such as grippers 70 mounted on a support such as rotatable head 68. Arm members 74 may be positioned using positioners 76 at rotating joints. If desired, other robotic positioners may be used in the test system. For example, robotic systems may be used in which arms extend and retract using screw mechanisms or telescoping members, in which grippers and other mechanisms slide linearly along rails, in which conveyor belts are used to move devices under test, etc.

Figure 6:
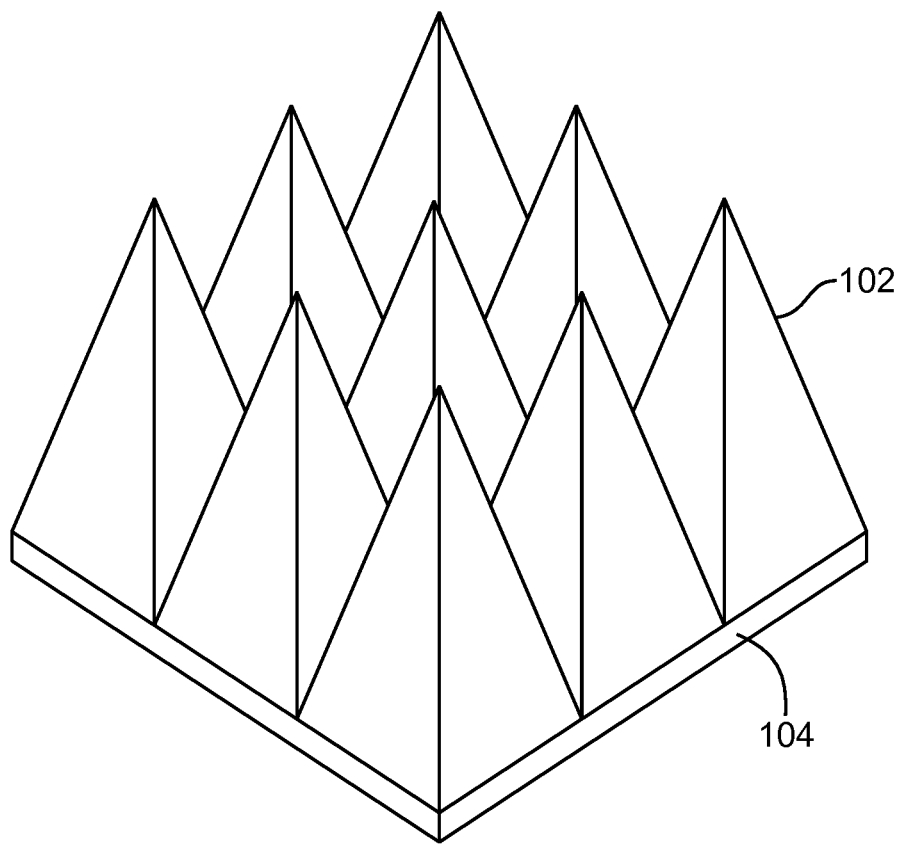
FIG. 6 is a perspective view of a portion of an anechoic chamber wall with pyramidal absorbers for reducing reflections in a wireless test chamber in accordance with an embodiment of the present invention.

FIG. 6 is a perspective view of a portion of the interior surface of the test chamber walls of test chamber 64 of FIG. 4. As shown in FIG. 6, wall 104 may be covered signal absorber structures such as pyramidal absorbers 102. If desired, other types of structures for reducing radio-frequency signal reflections from metal chambers walls may be used. The use of pyramidal absorbers 102 for the lining of anechoic chamber 64 of FIG. 4 is merely illustrative.

Figure 7:
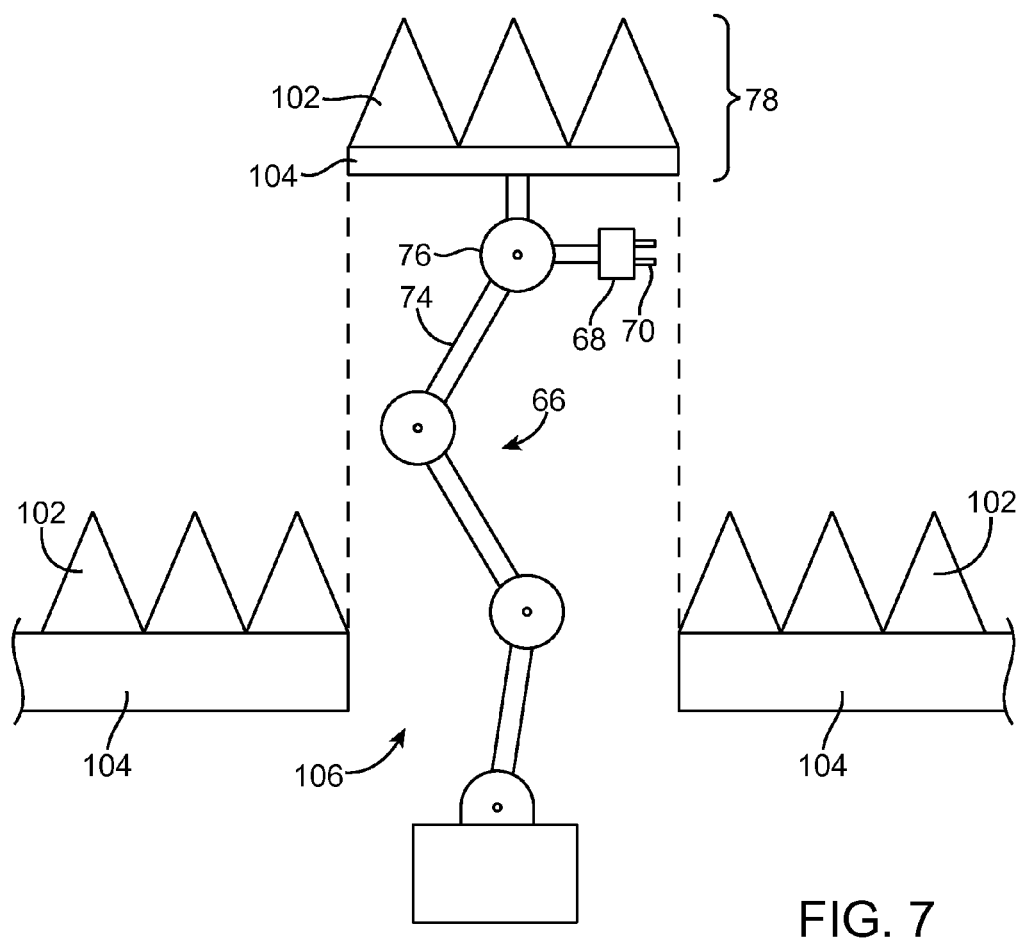
FIG. 7 is a cross-sectional side view of a portion of a wireless test chamber wall in which a trapdoor covered with pyramidal anechoic chamber wall absorbers has been formed to accommodate a robotic arm in accordance with an embodiment of the present invention.

As shown in FIG. 7, trapdoor 78 may be formed from a section of chamber wall 104 that is raised and lowered using robotic system 66 (e.g., trapdoor 78 may be attached to one of arm segments 74 or rotatable positioners 76 in system 66). Trapdoors such as trapdoor 78 of FIG. 7 and trapdoor 78 of FIG. 6 may be covered with a region of pyramidal absorbers 102. When trapdoor 78 is placed in its stowed position, wall 104 of chamber 64 will be closed over wall opening 106, so that radio-frequency interference will not reach the interior of chamber 64 and so that pyramidal absorbers 102 on trapdoor 78 will lie flush with pyramidal absorbers 102 on adjacent portions of chamber wall 104.

Figure 8:
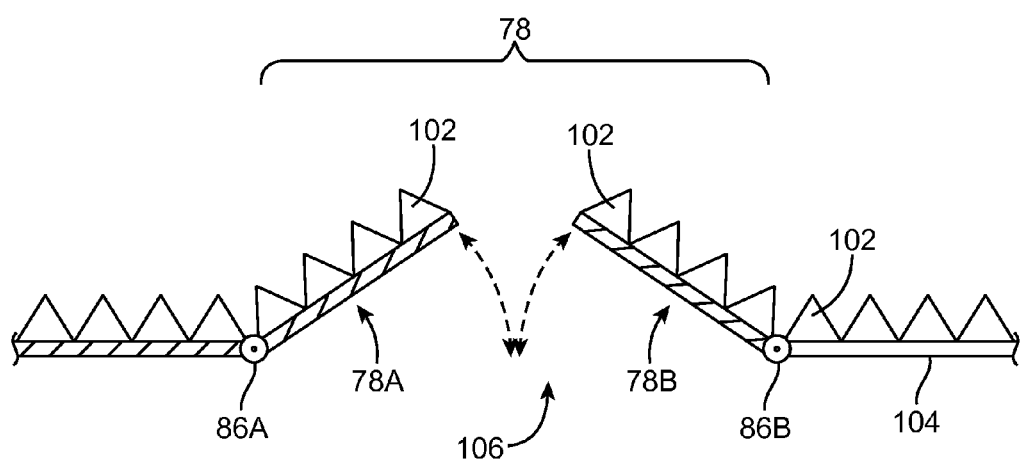
FIG. 8 is a cross-sectional side view of a two-sided trapdoor covered with pyramidal anechoic chamber wall absorbers in a wireless test chamber to accommodate a robotic arm in accordance with an embodiment of the present invention.

FIG. 8 is a cross-sectional side view of trapdoor 78 in a configuration in which trapdoor 78 has multiple sections. As shown in FIG. 8, left-hand trapdoor section 78A may be coupled to chamber wall 104 using positioner 86A or a hinge. Right-hand trapdoor section 78B may be coupled to chamber wall 104 using positioner 86B or a hinge. Positioners 86A and 86B or other computer-controlled trapdoor positioning equipment such as arm 66 of FIG. 6 may be controlled by storage and processing circuitry 65 (FIG. 4). Trapdoors may also be open and closed manually or may be open and closed using robotic arm 66.

Figure 9:
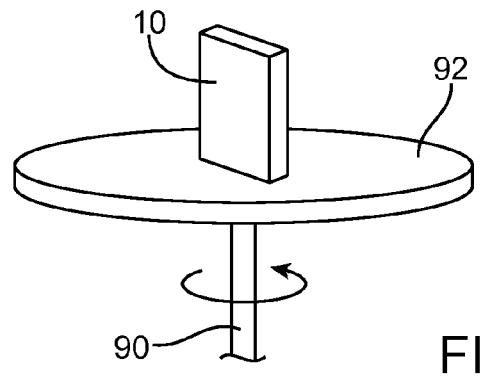
FIG. 9 is a perspective view of a rotating wireless test chamber turntable on which a device under test is resting on an end surface in accordance with an embodiment of the present invention.

FIG. 9 is a perspective view of turntable 92 in a configuration in which robotic system 66 has been used to place device under test 10 in an upright position balanced on one of its ends during testing. After testing of device under test 10 in the configuration shown in FIG. 9, robotic system 66 may flip device under test 10 so that device under test 10 is resting with its opposing end on turntable 92 (as an example).

Figure 10:
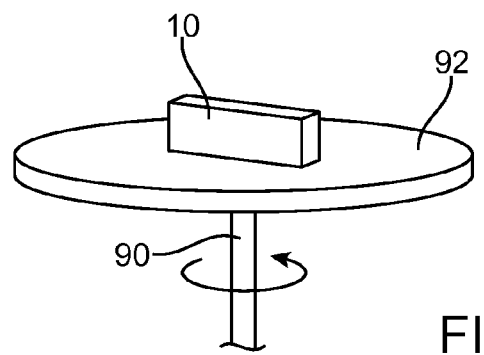
FIG. 10 is a perspective view of a rotating wireless test chamber turntable on which a device under test is resting on a side surface in accordance with an embodiment of the present invention.

FIG. 10 is a cross-sectional side view of device under test 10 in a configuration in which robotic system 66 has been used to place device under test 10 on one of its sides on turntable 92. Following rotation of turntable 92 to test device under test 10, robotic system 66 may flip device under test 10 so that its opposing side is placed on top of turntable 92.

Figure 11:
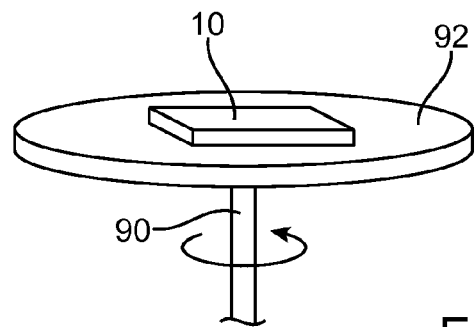
FIG. 11 is a perspective view of a rotating wireless test chamber turntable on which a device under test is resting on a rear surface in accordance with an embodiment of the present invention.

FIG. 11 shows how robotic system 66 may place device under test 10 in a face up configuration on turntable 92. Following face-up testing, the robotic system may flip the device under test, placing the device under test in a face-down configuration. Robotic system 66 may also place device under test 10 in angled orientations on turntable 92 or other support structures within chamber 64 if desired. The illustrative configurations of FIGS. 9, 10, and 11 are merely illustrative.

Figure 12:
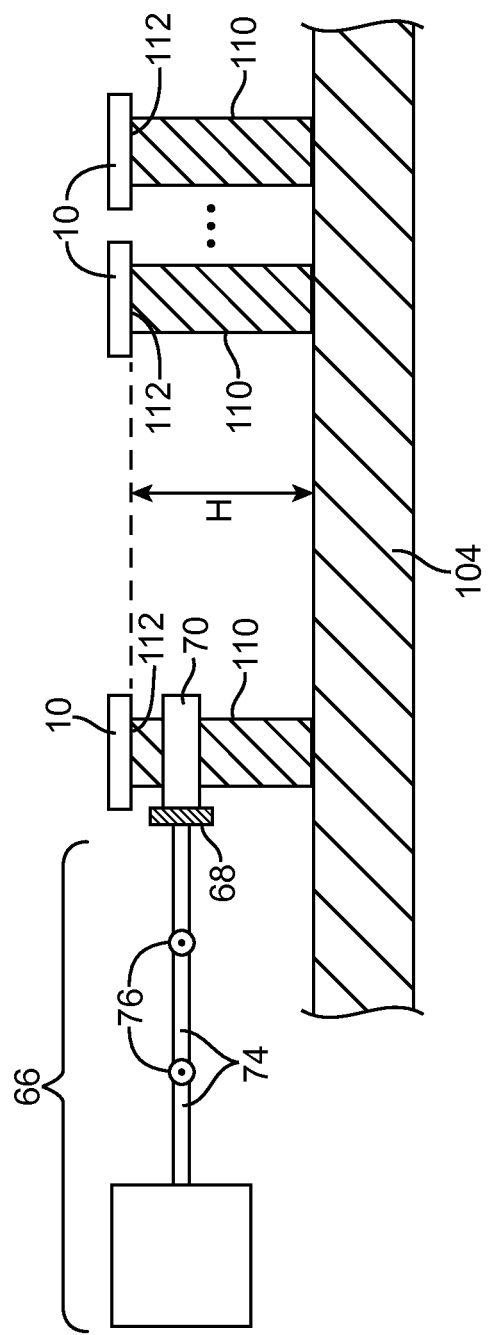
FIG. 12 is a side view of a robotic wireless test chamber arm being used to position devices under test that are resting on dielectric support structures within a wireless test chamber in accordance with an embodiment of the present invention.

FIG. 12 shows how dielectric support structures such as dielectric foam members may be used as carriers and supports for devices under test. As shown in FIG. 12, devices under test 10 may be mounted on upper surfaces 112 of support structures 110. Support structures 110 may be blocks of foam or other dielectric material that does not interfere with wireless testing of devices under test 10 in chamber 64. The presence of a support structure such as support structures 110 during testing helps maintain a device under test at a desired height H above chamber wall floor 104 or other surface on which robotic system 66 places the device under test. As described in connection with docking station 24' of FIG. 4, it may be desirable to exclude conductive structures such as unused devices under test 10 (e.g., devices that are being charged or otherwise not being used to perform wireless tests) from chamber 64 during testing. It may therefore be desirable for robotic system 66 to place a selected one of devices under test 10 and support structures 110 within chamber 64 during testing while placing the remaining devices under test (and, if desired, supports 110) outside of chamber 64. Robotic system 66 may move the devices under test and support structures through trapdoor 78 as needed.

Figure 13:
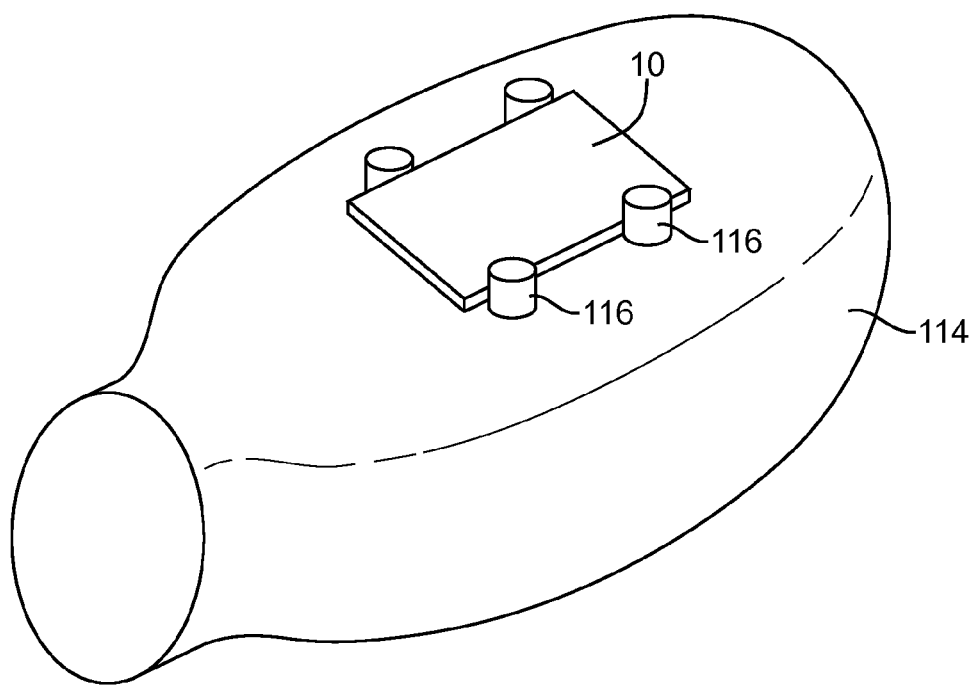
FIG. 13 is a perspective view of a phantom head with support posts for holding a device under test in a wireless test chamber with a robotic arm in accordance with an embodiment of the present invention.

Wireless tests may be performed using phantom body parts such as phantom head 114 of FIG. 13. Phantom heads such as phantom head 114 (sometimes referred to as a standard anthropomorphic model) may have the shape of a human head (e.g., a head with ears, cheeks, facial features, and other features of a head). Phantom body parts may be formed from hollow plastic and filled with tissue-equivalent liquid or may be formed form solid dielectric (e.g., solid plastic). Support structures 116 may be used as guiding structures that guide device under test 10 into a desired position with respect to the features of phantom head 114 and may be used to maintain device under test 10 in this position during testing. While device under test 10 is being maintained in position by support structures 116, the wireless test system may be used in making radio-frequency radiation pattern measurements and other test measurements (e.g., measurements of emitted radio-frequency radiation levels—sometimes referred to as specific absorption rate tests).

Figure 14:
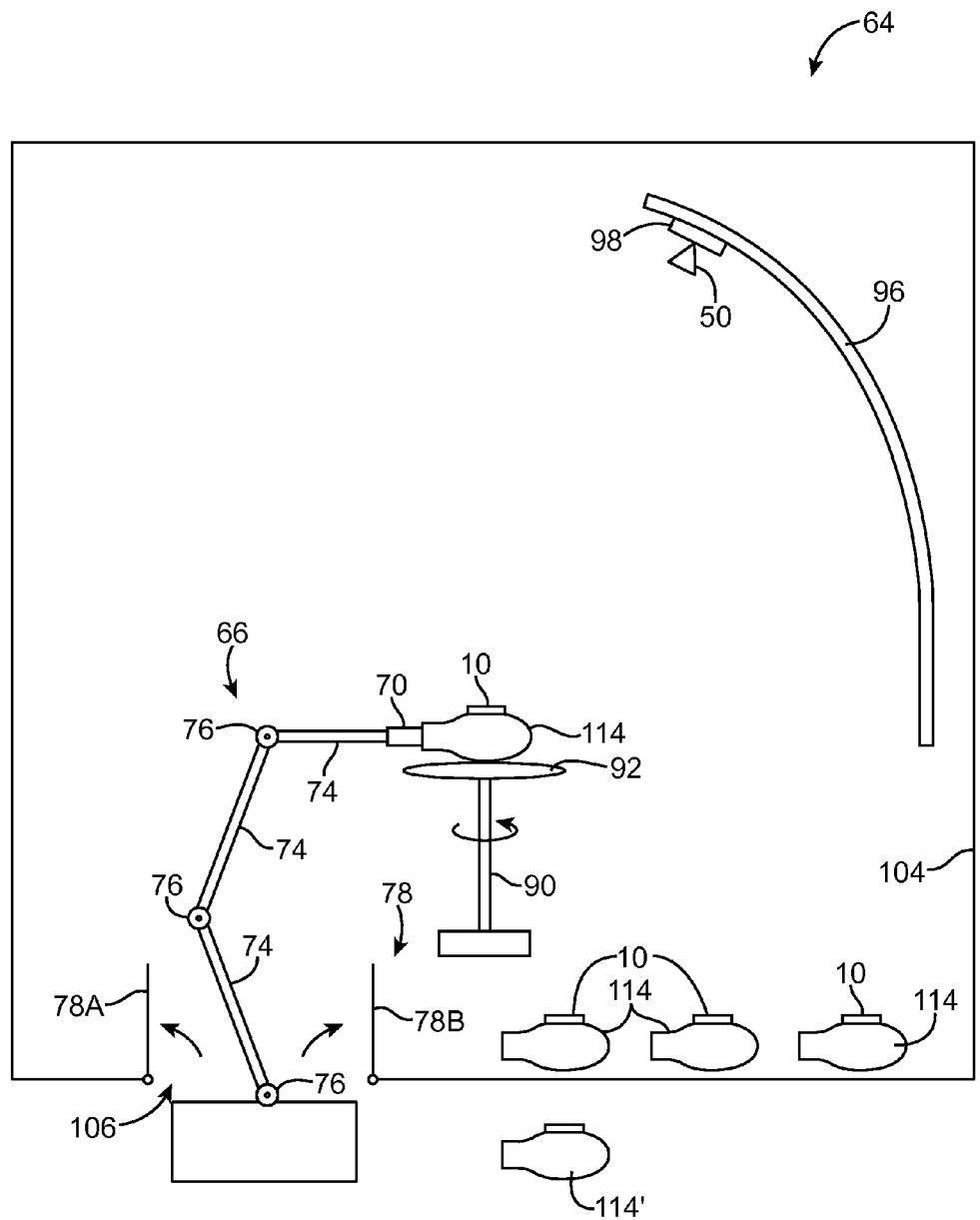
FIG. 14 is a side view of a wireless test system in which a robotic arm is being used to perform wireless tests on devices under test that have been mounted on respective phantom heads in accordance with an embodiment of the present invention.

FIG. 14 shows how phantom heads 114 may be stored within chamber 64. If desired, heads 114 may be stored outside of chamber 64, as shown by illustrative head 114'. In configurations in which phantom head 114' is stored outside of chamber 64, robotic arm 66 can move the phantom head and associated device under test through chamber wall opening 106 using trapdoor 78.

Figure 15:
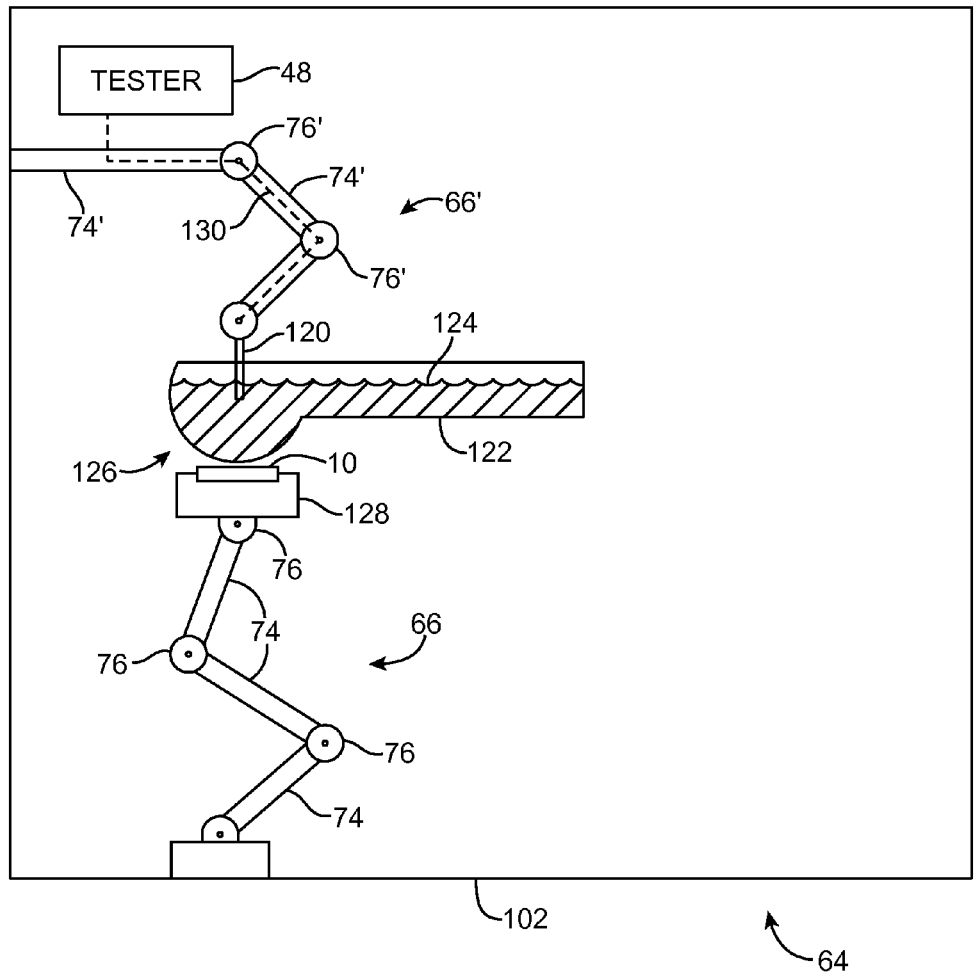
FIG. 15 is a side view of a wireless test system of the type in which specific absorption rate measurements on a device under test are being made using a robotic arm in accordance with an embodiment of the present invention.

FIG. 15 is a cross-sectional side view of test chamber 64 in a configuration in which device under test 10 is being tested for emitted radiation levels (i.e., device under test 10 is being subjected to specific absorption rate tests). Robotic arm 66 may be used to position device under test 10 in one or more positions adjacent to phantom head portion 126 of phantom body 122 during testing. Dielectric support structure 128 may serve as a dielectric interface between device under test 10 and robotic arm 66. This may help to ensure that metal structures in robotic arm 66 will not affect test results. Dielectric support structure 128 may be formed from a block of plastic such as plastic foam. Phantom body 112 may be a hollow plastic phantom test structure that is filled with tissue-equivalent liquid 124. Probe 120 can be immersed in liquid 124 by robotic system 66'. Robotic system 66' may use arm segments 74' and positioners 76' to move probe 120 in a desired pattern within liquid 124 that allows emitted radiation levels from device 10 to be mapped in three dimensions. Tester 48, which may be coupled to probe 120 by path 130, may gather power readings and other data from probe head 120 during testing.

Figure 16:
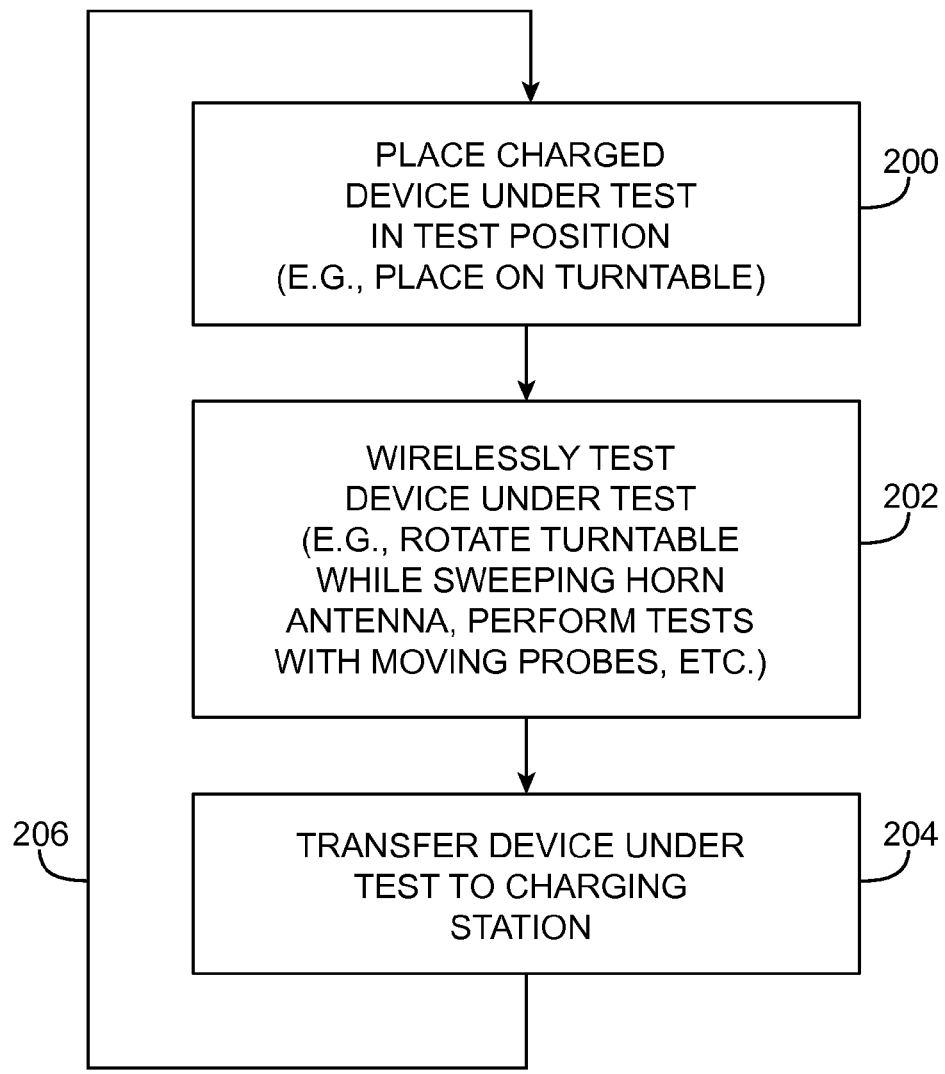
FIG. 16 is a flow chart of illustrative steps involved in using robotic test systems to perform wireless tests on devices under test in a test chamber in accordance with an embodiment of the present invention.

Illustrative steps involved in testing devices under test 10 using robotic test systems are shown in FIG. 16.

At step 200, robotic system 66 may place a charged device under test 10 in a desired test location within test chamber 64. Devices under test may be stored outside of chamber 64 or may be stored inside chamber 64. The batteries within the devices under test may be charged by docking the devices under test in a docking station that supplies power to the devices under test using charging circuitry such as charging circuitry 62 from line power 60 or other power source. If desired, devices under test 10 may be mounted on support structures such as dielectric support members 112 of FIG. 12 and phantom head 114 of FIG. 13. In this type of configuration, robotic system 66 may move the support structure into a desired test location during the operations of step 200. When moving device under test 10 (and, if desired, associated dielectric support structures) from the exterior of chamber 64 to the interior of chamber 64, robotic system 66 may pass through chamber wall opening 106 using trapdoor structures 76.

Inside chamber 64, robotic system 66 may position device under test 10 in a desired location using support structures such as support structure 112 of FIG. 12 or phantom head 114 of FIG. 13 and/or may place device under test 10 directly on turntable 92 or other test system support structure. During tests of emitted radiation levels, robotic system 66 may hold device under test 10 in a desired position using support structure 128.

After placing device under test 10 in test chamber 64, device under test 10 may be wirelessly tested (step 202).

During the operations of step 202, test equipment 52 may be used to gather wireless test results (e.g., antenna efficiency patterns, emitted power levels, etc.). In systems with turntable 92 or similar structures for ensuring complete coverage for device testing under a variety of orientations with respect to the test antennas in the chamber, the turntable, test antenna positioner, and other systems for positioning device under test 10 and/or test antennas in the chamber may be used to move device under test 10 and/or test antenna structures 50 while gathering test data. When performing emitted radiation level testing using a system of the type shown in FIG. 15, probe 120 may be moved by robotic system 66' and device under test 10 may be moved between various different positions relative to phantom head 126 and body 122.

If the battery in device under test 10 becomes depleted, robotic system 66 may transfer device under test 10 to a charging system such as docking station 24 or 24' of FIG. 4. If desired, device under test 10 may be moved through chamber wall opening 106 using trapdoor 78. Trapdoor structures such as trapdoor 78 may, if desired, be built into a sub-chamber that is enclosed within chamber 64 (e.g., a storage locker on the floor of chamber 64) or may be located directly under a room-shaped version of chamber 64 (e.g., the trapdoor structures may provide access to a storage location that lies directly under chamber floor 102). Trapdoors such as trapdoor 78 may also be created in the side walls or the ceiling of chamber 64. After the device under test with the depleted battery has been transferred to docking station 24 or 24', robotic system 66 may wait until charging is complete to return device under test 10 to its testing location or may select a different (fully charged) device under test from docking station 24 for testing while the initial device under test is charged. Testing may then continue at step 200, as indicated by line 206. Serial numbers or other tracking numbers may be used to track which devices under test are being tested, so that it is not necessary to exhaustively test one device under test 10 before beginning to test another device under test.

The foregoing is merely illustrative of the principles of this invention and various modifications can be made by those skilled in the art without departing from the scope and spirit of the invention. The foregoing embodiments may be implemented individually or in any combination.

What is claimed is:

1. A wireless test system for testing radio-frequency transceiver circuitry in devices under test, comprising:
    a test chamber having an interior configured to receive the device under test;
    at least one test antenna that is configured to wirelessly test the device under test within the test chamber;
    a robotic system configured to position the device under test within the test chamber;
    movable support structures that move the device under test during wireless testing with the test antenna; and
    a docking station having a plurality of connectors, wherein each of the connectors is configured to mate with a port in the device under test.

2. The wireless test system defined in claim 1 wherein the movable support structures comprise a turntable that rotates the device under test.

3. The wireless test system defined in claim 2 where the robotic system is configured to place the device under test on the turntable.

4. The wireless test system defined in claim 3 wherein the robotic system comprises a robotic arm.

5. The wireless test system defined in claim 4 wherein the test chamber has a wall, the wireless test system further comprising a trapdoor that covers an opening in the wall.

6. The wireless test system defined in claim 5 further comprising pyramidal absorbers on an inner surface of the wall and on the trapdoor.

7. The wireless test system defined in claim 1 further comprising charging circuitry and a connector coupled to the charging circuitry, wherein the connector is configured to mate with the device under test to charge a battery in the device under test.

8. The wireless test system defined in claim 7 wherein the robotic system is configured to couple the device under test to the connector.

9. The wireless test system defined in claim 1 wherein the robotic system comprises arm segments and positioners that move the arm segments.

10. The wireless test system defined in claim 1 further comprising a positioner that moves the test antenna during wireless testing.

11. The wireless test system defined in claim 10 wherein the movable support structures comprise a turntable that supports the device under test, wherein the robotic system comprises a robotic arm with grippers that is configured to place the device under test on the turntable.

12. The wireless test system defined in claim 1 further comprising a trapdoor through which the robotic system moves the device under test when moving the device under test between the docking station and the interior of the test chamber.

13. A method for wirelessly testing a device under test in a test chamber using a phantom body structure, comprising:
    with a robotic system, moving the device under test within the test chamber to a desired position relative to the phantom body structure; and
    after moving the device under test with the robotic system, performing wireless testing on the device under test using test equipment.

14. The method defined in claim 13 wherein the robotic system comprises a robotic arm, the method further comprising holding the device under test in the desired position relative to the phantom body structure with the robotic arm during the wireless testing.

15. The method defined in claim 14 wherein performing the wireless testing comprises making emitted radiation level test measurements with a test probe.

16. The method defined in claim 15 wherein the phantom body structure includes a phantom head filled with liquid and wherein performing the wireless testing comprises making the emitted radiation level test measurements while the test probe is in the liquid.

17. A method of wirelessly testing a device under test in a test chamber having a movable test antenna and a rotatable support structure, comprising:
    using a robotic system to place a device under test on the rotatable support structure;
    positioning the test antenna using a positioner; and
    rotating the rotatable support structure to rotate the device under test relative to the test antenna.

18. The method defined in claim 17 further comprising using the robotic system to couple the device under test to a connector that charges a battery within the device under test.

19. The method defined in claim 18 wherein the robotic system has a robotic arm and grippers and wherein using the robotic system comprises gripping the device under test with the grippers and bending the robotic arm.

20. A wireless test system for testing radio-frequency transceiver circuitry in devices under test, comprising:

a test chamber having an interior configured to receive the device under test, wherein the test chamber has test chamber walls and pyramidal absorbers on the test chamber walls;

at least one test antenna that is configured to wirelessly test the device under test within the test chamber;

a dielectric support structure on which the device under test rests; and a robotic system configured to move the dielectric support structure and the device under test resting on the dielectric support structure.

21. The wireless test system defined in claim 20 wherein the robotic system comprises grippers that are configured to grip the dielectric support structure.

22. The wireless test system defined in claim 21 wherein the dielectric support structure comprises a phantom head.

* * * * *